United States Patent
Yang

(10) Patent No.: US 11,721,751 B2
(45) Date of Patent: Aug. 8, 2023

(54) HEMT AND METHOD OF FABRICATING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 264 days.

(21) Appl. No.: 17/153,844

(22) Filed: Jan. 20, 2021

(65) Prior Publication Data

US 2022/0165873 A1 May 26, 2022

(30) Foreign Application Priority Data

Nov. 26, 2020 (CN) .......................... 202011350160.0

(51) Int. Cl.
| | |
|---|---|
| *H01L 29/778* | (2006.01) |
| *H01L 29/20* | (2006.01) |
| *H01L 29/66* | (2006.01) |
| *H01L 29/47* | (2006.01) |
| *H01L 21/285* | (2006.01) |
| *H01L 29/205* | (2006.01) |
| *H01L 29/423* | (2006.01) |

(52) U.S. Cl.
CPC .... *H01L 29/7786* (2013.01); *H01L 21/28581* (2013.01); *H01L 29/2003* (2013.01); *H01L 29/205* (2013.01); *H01L 29/4238* (2013.01); *H01L 29/42372* (2013.01); *H01L 29/42376* (2013.01); *H01L 29/475* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 8,716,754 B2 | 5/2014 | Park | |
| 10,573,734 B1 * | 2/2020 | Chou | ................ H01L 29/66462 |
| 2013/0083567 A1 | 4/2013 | Imada | |
| 2018/0308968 A1 * | 10/2018 | Miura | ................ H01L 21/0262 |

\* cited by examiner

*Primary Examiner* — Grant S Withers
(74) *Attorney, Agent, or Firm* — Winston Hsu

(57) ABSTRACT

An HEMT includes a first III-V compound layer. A second III-V compound layer is disposed on the first III-V compound layer. The composition of the first III-V compound layer is different from that of the second III-V compound layer. A gate is disposed on the second III-V compound layer. The gate includes a first P-type III-V compound layer, an undoped III-V compound layer and an N-type III-V compound layer are deposited from bottom to top. The first P-type III-V compound layer, the undoped III-V compound layer, the N-type III-V compound layer and the first III-V compound layer are chemical compounds formed by the same group III element and the same group V element. A drain electrode is disposed at one side of the gate. A drain electrode is disposed at another side of the gate. A gate electrode is disposed directly on the gate.

6 Claims, 4 Drawing Sheets

HEMT AND METHOD OF FABRICATING THE SAME

BACKGROUND OF THE INVENTION

1. Field of the Invention

The present invention relates to a high electron mobility transistor (HEMT), and more particularly to a structure and a fabricating method of an HEMT which can prevent current leakage between a gate electrode and a gate.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, current leakage often occurs between a gate electrode and a gate of an HEMT; therefore, the efficiency of the HEMT is decreased.

SUMMARY OF THE INVENTION

In light of above, a structure of an HEMT which can prevent current leakage is provided.

According to a preferred embodiment of the present invention, an HEMT includes a first III-V compound layer. A second III-V compound layer is disposed on the first III-V compound layer, wherein a composition of the first III-V compound layer is different from a composition of the second III-V compound layer. A gate is disposed on the second III-V compound layer, wherein the gate includes a first P-type III-V compound layer, an undoped III-V compound layer and an N-type III-V compound layer deposited from bottom to top, wherein the first P-type III-V compound layer, the undoped III-V compound layer, the N-type III-V compound layer and the first III-V compound layer are chemical compounds formed by the same group III element and the same group V element. A source electrode is disposed at one side of the gate. A drain electrode is disposed at another side of the gate. A gate electrode is disposed directly on the gate.

According to a preferred embodiment of the present invention, a fabricating method of an HEMT includes forming a first III-V compound layer, a second III-V compound layer, a first P-type III-V compound layer, an undoped III-V compound layer and an N-type III-V compound layer deposited from bottom to top, wherein the first P-type III-V compound layer, the undoped III-V compound layer, the N-type III-V compound layer and the first III-V compound layer are chemical compounds formed by the same group III element and the same group V element. Later, the N-type III-V compound layer, the undoped III-V compound layer and the first P-type III-V compound layer are patterned to form a gate. Finally, a source electrode, a drain electrode and a gate electrode are formed, wherein the gate electrode is disposed directly on the gate, the source electrode and the drain electrode are respectively at two sides of the gates.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 depict a fabricating method of an HEMT according to a first preferred embodiment of the present invention, wherein:

FIG. 1 shows a substrate with III-V compound layers;
FIG. 2 is a fabricating stage following FIG. 1;
FIG. 3 is a fabricating stage following FIG. 2;
FIG. 7 to FIG. 8 depict a fabricating method of an HEMT according to a second preferred embodiment of the present invention, wherein:

FIG. 7 shows a substrate with III-V compound layers; and
FIG. 8 is a fabricating stage following FIG. 7.

DETAILED DESCRIPTION

Figure 1:
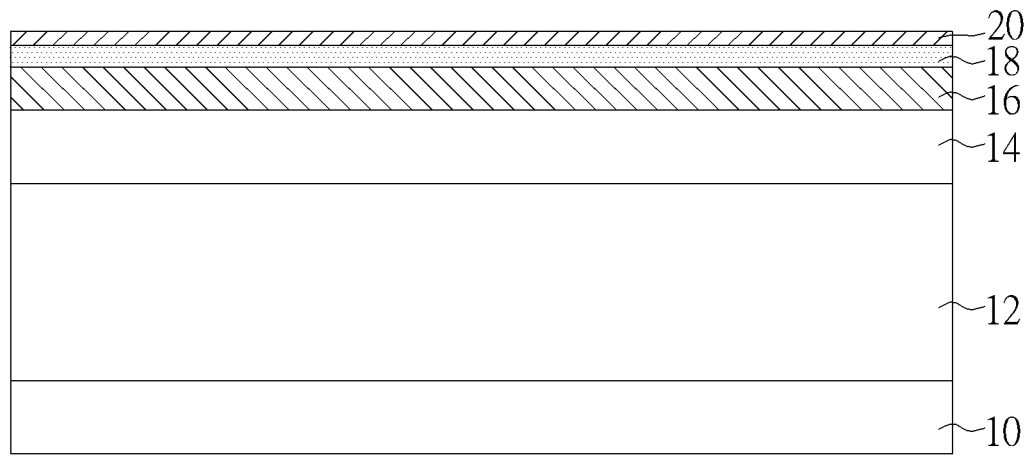
Figure 2:
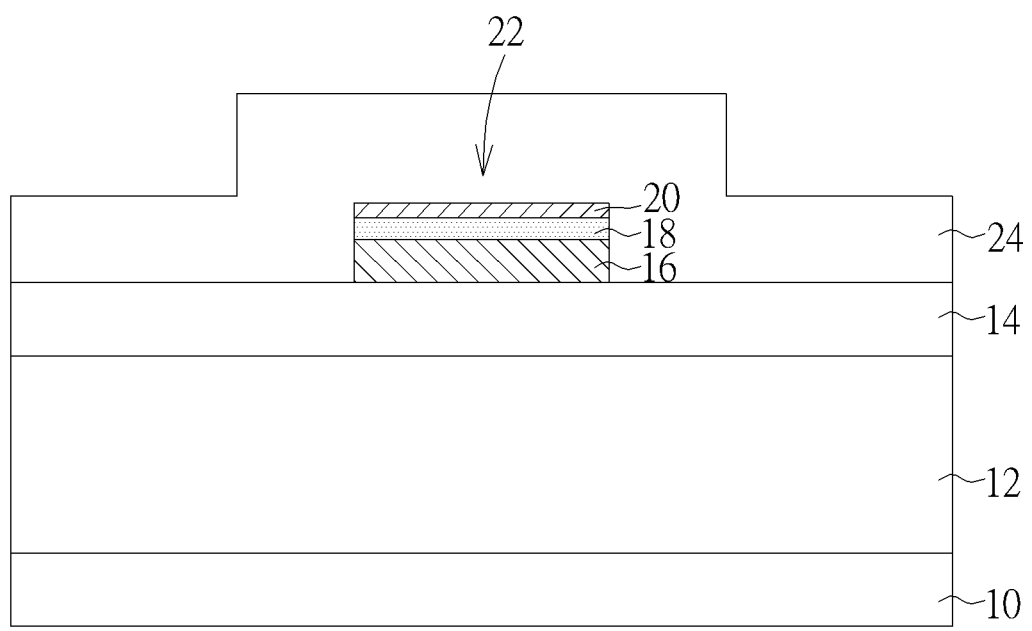
Figure 3:
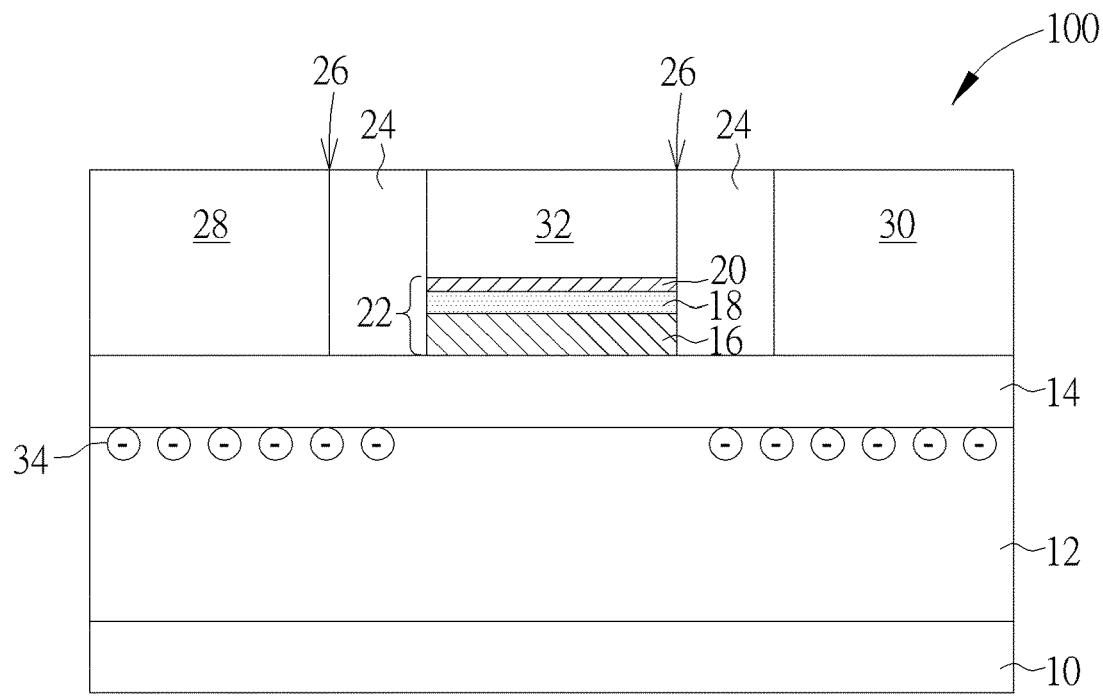

FIG. 1 to FIG. 3 depict a fabricating method of an HEMT according to a first preferred embodiment of the present invention.

As shown in FIG. 1, a substrate 10 is provided. Later, a first III-V compound layer 12, a second III-V compound layer 14, a first P-type III-V compound layer 16, an undoped III-V compound layer 18 and an N-type III-V compound layer 20 are formed to deposit from bottom to top. The first P-type III-V compound layer 16, the undoped III-V compound layer 18, the N-type III-V compound layer 20 and the first III-V compound layer 12 are chemical compounds formed by the same group III element and the same group V element. The first III-V compound layer 12 is gallium nitride. The second III-V compound layer includes aluminum gallium nitride, aluminum indium nitride, aluminum indium gallium nitride or aluminum nitride. For example, the first III-V compound layer 12 is gallium nitride, and the second III-V compound layer 14 is N-type aluminum gallium nitride, P-type aluminum gallium nitride or undoped aluminum gallium nitride. The first P-type III-V compound layer 16 is P-type gallium nitride. The undoped III-V compound layer 18 is undoped gallium nitride. The N-type III-V compound layer 20 is N-type gallium nitride. Moreover, according to a preferred embodiment of the present invention, the second III-V compound layer 14 is undoped aluminum gallium nitride or P-type aluminum gallium nitride. Moreover, a thickness of the undoped III-V compound layer 18 is greater than a thickness of the N-type III-V compound layer 20.

As shown in FIG. 2, the N-type III-V compound layer 20, the undoped III-V compound layer 18 and the first P-type III-V compound layer 16 are patterned to form a gate 22.

The pattering can be performed by an etching process. During the etching process, the N-type III-V compound layer 20, the undoped III-V compound layer 18 and the first P-type III-V compound layer 16 are etched by taking the second III-V compound layer 14 as an etching stop layer. Later, a protective layer 24 is conformally formed to cover the second III-V compound layer 14 and the gate 22.

As shown in FIG. 3, the protective layer 24 is patterned to form numerous openings 26 thereon. Next, a source electrode 28, a drain electrode 30 and a gate electrode 32 are respectively formed in each of the openings 26. The gate electrode 32 is disposed directly on the gate 22 and contacts the N-type III-V compound layer 20. The source electrode 28 and the drain electrode 30 are respectively at two sides of the gate 22. Both of the source electrode 28 and the drain electrode 30 contact the second III-V compound layer 14. Now, a normally-off HEMT 100 of the present invention is completed.

As shown in FIG. 3, an HEMT 100 includes a substrate 10. A first III-V compound layer 12 covers the substrate 10. A second III-V compound layer 14 is disposed on and contacts the first III-V compound layer 12. A composition of the first III-V compound layer 12 is different from a composition of the second III-V compound layer 14. A gate 22 is disposed on and contacts the second III-V compound layer 14. The gate 22 consists of a first P-type III-V compound layer 16, an undoped III-V compound layer 18 and an N-type III-V compound layer 20 deposited from bottom to top. In other words, besides the first P-type III-V compound layer 16, the undoped III-V compound layer 18 and the N-type III-V compound layer 20, there is no other material layer within the gate 22. The first P-type III-V compound layer 16, the undoped III-V compound layer 18, the N-type III-V compound layer 20 and the first III-V compound layer 12 are chemical compounds formed by the same group III element and the same group V element. The first III-V compound layer 12 is gallium nitride, the second III-V compound layer 14 includes aluminum gallium nitride, aluminum indium nitride, aluminum indium gallium nitride or aluminum nitride. For example, the first III-V compound layer 12 is gallium nitride, and the second III-V compound layer 14 is N-type aluminum gallium nitride, P-type aluminum gallium nitride or undoped aluminum gallium nitride. The first P-type III-V compound layer 16 is P-type gallium nitride. The undoped III-V compound layer 18 is undoped gallium nitride. The N-type III-V compound layer 20 is N-type gallium nitride. Moreover, according to a preferred embodiment of the present invention, the second III-V compound layer 14 is undoped aluminum gallium nitride or P-type aluminum gallium nitride. Furthermore, a thickness of the undoped III-V compound layer 18 is greater than a thickness of the N-type III-V compound layer 20.

According to a preferred embodiment of the present invention, the a thickness of the first P-type III-V compound layer 16 is 2 to 6 times of a thickness of the undoped III-V compound layer 18, and the thickness of the first P-type III-V compound layer 16 is 2 to 3 times of a thickness of the N-type III-V compound layer 20. A summation of the thickness of the N-type III-V compound layer 20 and the thickness of the undoped III-V compound layer 18 is $\frac{2}{3}$ to 1 times of the first P-type III-V compound layer 16.

A source electrode 28 is disposed at one side of the gate 22 and contacts the second III-V compound layer 14. A drain electrode 30 is disposed at another side of the gate 22 and contacts the second III-V compound layer 14. A gate electrode 32 is disposed directly on the gate 22 and contacts the gate 22. The source electrode 28, the drain electrode 30 and the gate electrode 32 respectively includes titanium, aluminum, platinum, nickel or gold. A protective layer 24 is disposed between the source electrode 28 and the gate 22, and between the drain electrode 30 and the gate 22. The protective layer 24 can be dielectrics such as silicon oxide, silicon nitride, silicon carbide nitride, silicon oxynitride, silicon carboxynitride, or aluminum nitride. A two-dimensional electron gas (2DEG) 34 is disposed within the first III-V compound layer 12.

Figure 4:
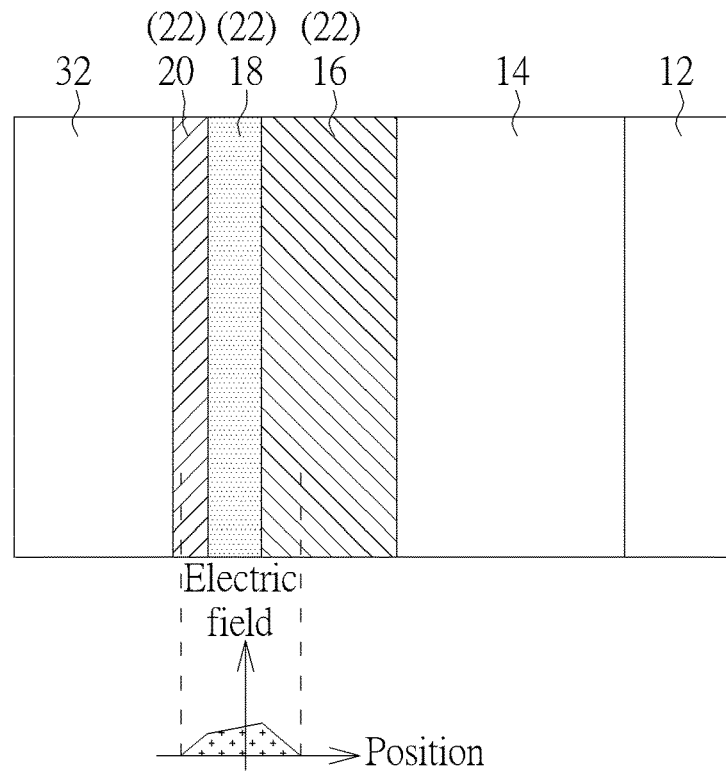
FIG. 4 depicts a graph of electric field vs. position of a partial region of an HEMT according to the first preferred embodiment of the present invention.

FIG. 4 depicts a graph of electric field vs. position of a partial region of an HEMT according to the first preferred embodiment of the present invention, wherein elements which are substantially the same as those in the first preferred embodiment are denoted by the same reference numerals; an accompanying explanation is therefore omitted. As shown in FIG. 4, the largest electric field occurs at the interface between the undoped III-V compound layer 18 and the first P-type III-V compound layer 16. That is, the electric field is smaller at the interface between the gate electrode 32 and the N-type III-V compound layer 20. Therefore, current leakage between the gate electrode 32 and the N-type III-V compound layer 20 can be prevented. Furthermore, the electric field from the N-type III-V compound layer 20 to the first P-type III-V compound layer 16 distributes uniformly. In this way, voltage endurance of the HEMT 100 is improved. Moreover, a threshold voltage of HEMT 100 can be adjusted by the thickness of the undoped III-V compound layer 18. When the thickness of the undoped III-V compound layer 18 increased, the threshold voltage of HEMT 100 is also increased.

Figure 5:
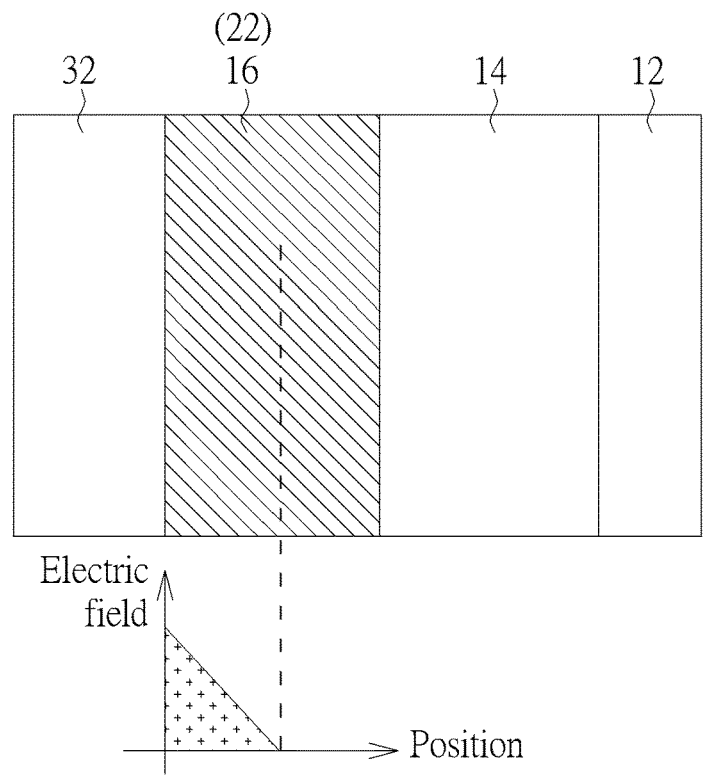
FIG. 5 depicts a graph of electric field vs. position of a partial region of an HEMT according to an example of the present invention.

FIG. 5 depicts a graph of electric field vs. position of a partial region of an HEMT according to an example of the present invention, wherein elements which are substantially the same as those in the first preferred embodiment are denoted by the same reference numerals; an accompanying explanation is therefore omitted. The gate 22 of the HEMT in FIG. 5 is formed only by the first P-type III-V compound layer 16. There is not the undoped III-V compound layer 18 and the N-type III-V compound layer 20 within the gate 22 of the HEMT in FIG. 5. As shown in FIG. 5, the largest electric field occurs at the interface between the gate electrode 32 and the first P-type III-V compound layer 16, and the electric field distributes less evenly comparing to FIG. 4. Because the largest electric field occurs at the interface between the gate electrode 32 and the first P-type III-V compound layer 16, current leakage is easily happened between the gate electrode 32 and the first P-type III-V compound layer 16. Moreover, because the electric field distributes less evenly, the HEMT with gate formed only by the first P-type III-V compound layer 16 has a lower voltage endurance.

Figure 6:
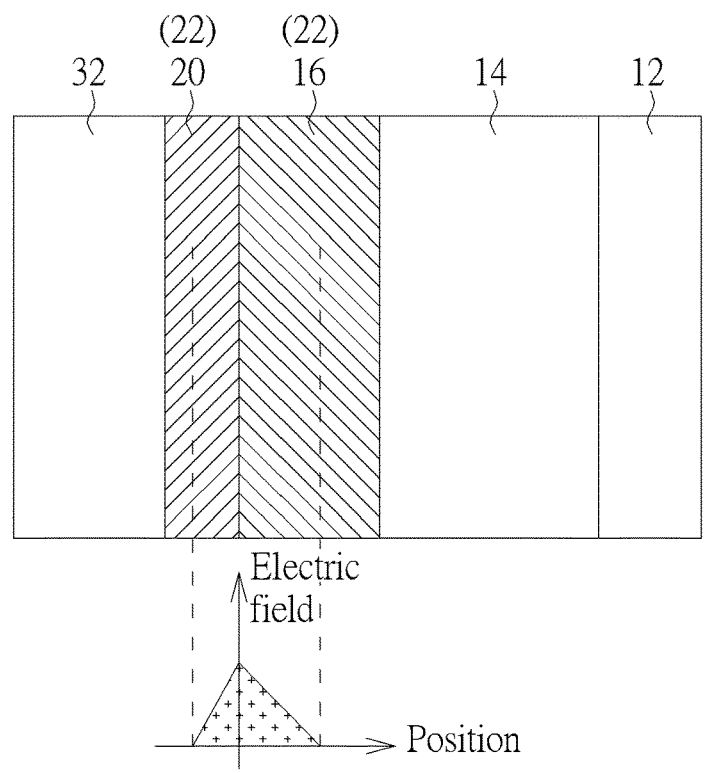
FIG. 6 depicts a graph of electric field vs. position of a partial region of an HEMT according to another example of the present invention.

FIG. 6 depicts a graph of electric field vs. position of a partial region of an HEMT according to another example of the present invention, wherein elements which are substantially the same as those in the first preferred embodiment are denoted by the same reference numerals; an accompanying explanation is therefore omitted. The gate 22 of the HEMT in FIG. 6 is formed by the first P-type III-V compound layer 16 and the N-type III-V compound layer 20. There is no undoped III-V compound layer 18 within the gate 22 of the HEMT in FIG. 6. As shown in FIG. 6, the largest electric field occurs at the interface between the N-type III-V compound layer 20 and the first P-type III-V compound layer 16, and the electric field distributes less evenly comparing to FIG. 4. Therefore, the HEMT with the gate 22 formed only by the first P-type III-V compound layer 16 and the N-type III-V compound layer 20 has a lower voltage endurance comparing to the HEMT 100 with the gate 22 formed by the N-type III-V compound layer 20, the undoped III-V compound layer 18 and first P-type III-V compound layer 16 in FIG. 4.

Figure 7:
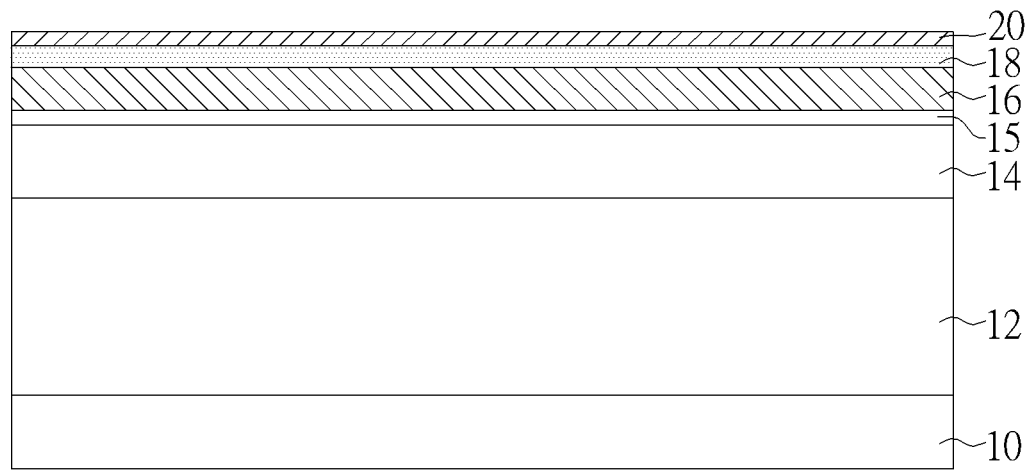
Figure 8:
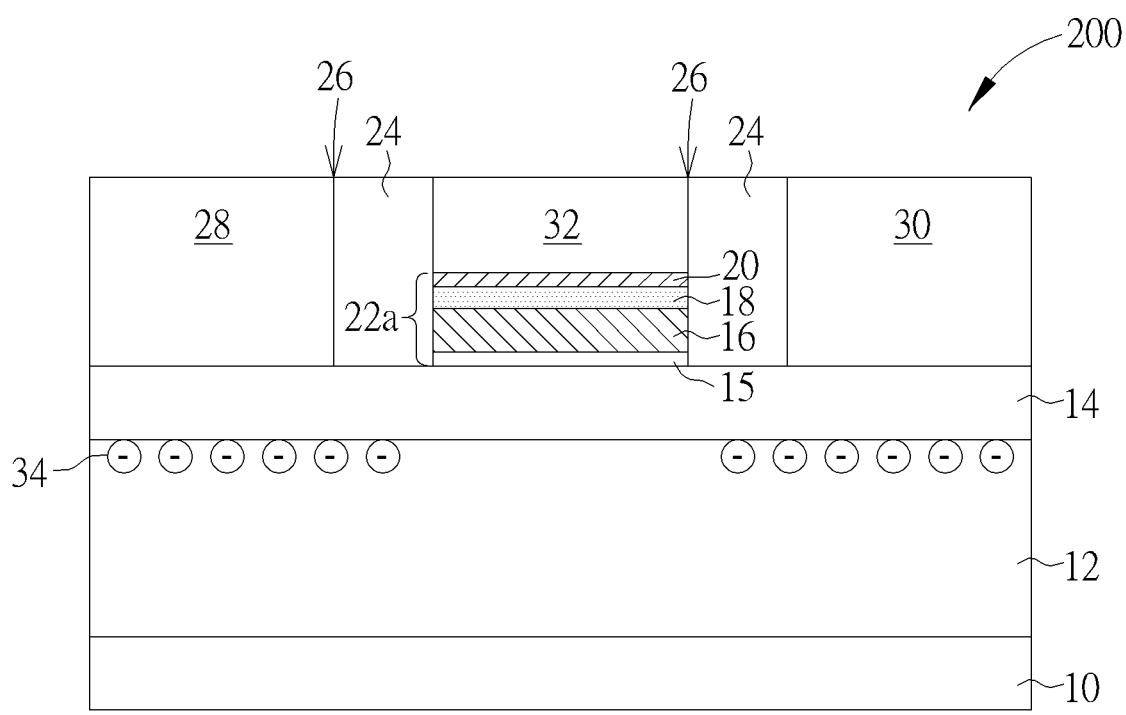

FIG. 7 to FIG. 8 depict a fabricating method of an HEMT according to a second preferred embodiment of the present invention. In FIG. 7 to FIG. 8, wherein elements which are substantially the same as those in the first preferred embodiment are denoted by the same reference numerals; an accompanying explanation is therefore omitted.

The difference between the first preferred embodiment and the second preferred embodiment is that in the second preferred embodiment, a second P-type III-V compound layer 15 is formed to cover the second III-V compound layer 14 before forming the first III-V compound layer 16 and after forming the second III-V compound layer 14. The second P-type III-V compound layer 15 and the second III-V compound layer 14 are composed of the same group III-V elements. For example, if the second III-V compound layer 14 is aluminum gallium nitride, the second P-type III-V compound layer 15 is P-type aluminum gallium nitride. It is noteworthy that a ratio of the group III element within the second III-V compound layer 14 is different from a ratio of the group III element within the second P-type III-V compound layer 15. To illustrate in more specific example, if the second III-V compound layer 14 and the second P-type III-V compound layer 15 are aluminum gallium nitride, and the ratio of the aluminum within the second P-type III-V compound layer 15 is smaller than the ratio of the aluminum within the second III-V compound layer 14. For example, the second P-type III-V compound layer 15 can be $Al_{0.3}Ga_{0.7}N$ and the second III-V compound layer 14 can be $Al_{0.45}Ga_{0.55}N$. However, based on different requirements, the ratio of the aluminum within the second P-type III-V compound layer 15 can be greater than the ratio of the aluminum within the second III-V compound layer 14.

After the second P-type III-V compound layer 15 is formed, a first P-type III-V compound layer 16, an undoped III-V compound layer 18 and an N-type III-V compound layer 20 are formed to deposit from bottom to top as described in the first preferred embodiment. As shown in FIG. 8, the N-type III-V compound layer 20, the undoped III-V compound layer 18, the first P-type III-V compound layer 16 and the second P-type III-V compound layer 15 are patterned to form a gate 22a. Later, a protective layer 24 is formed to cover the gate 22a and the second III-V compound layer 14. Next, a source electrode 28, a drain electrode 30 and a gate electrode 32 are formed. The source electrode 28 is formed at one side of the gate 22a, the drain electrode 30 is formed at another side of the gate 22a and the gate electrode 32 is formed on the gate 22a. Now, a normally-off HEMT 200 of the present invention is completed. The difference between the HEMT 200 and the HEMT 100 is the materials for making up the gate 22a and gate 22. The gate 22a of the HEMT 200 has an extra second P-type III-V compound layer 15. On the other hand, the gate 22 of the HEMT 100 does not contain the second P-type III-V compound layer 15. However, both of the HEMT 200 and HEMT 100 can prevent current leakage from the gate electrode and can sustain high voltage.

In the present invention, an undoped III-V compound layer is added in the gate and a second P-type III-V compound layer 15 is optionally disposed within the gate. In this way, current leakage from the gate electrode can be prevented and breakdown voltage of an HEMT can be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a first III-V compound layer;
   a second III-V compound layer disposed on the first III-V compound layer, wherein a composition of the first III-V compound layer is different from a composition of the second III-V compound layer;
   a gate disposed on the second III-V compound layer, wherein the gate comprises: a first P-type III-V compound layer, an undoped III-V compound layer and an N-type III-V compound layer deposited from bottom to top, wherein the first P-type III-V compound layer, the undoped III-V compound layer, the N-type III-V compound layer and the first III-V compound layer are chemical compounds formed by the same group III element and the same group V element;
   a source electrode disposed at one side of the gate;
   a drain electrode disposed at another side of the gate; and
   a gate electrode disposed directly on the gate; and
   wherein the gate further comprises a second P-type III-V compound layer disposed under the first P-type III-V compound layer, the second P-type III-V compound layer and the second III-V compound layer are composed of the same group III-V elements.

2. The HEMT of claim 1, wherein the second P-type III-V compound layer is P-type aluminum gallium nitride, and the second III-V compound layer is undoped aluminum gallium nitride.

3. The HEMT of claim 1, wherein the first III-V compound layer is gallium nitride, the second III-V compound layer comprises aluminum gallium nitride, aluminum indium nitride, aluminum indium gallium nitride or aluminum nitride.

4. The HEMT of claim 1, wherein a thickness of the undoped III-V compound layer is greater than a thickness of the N-type III-V compound layer.

5. The HEMT of claim 1, wherein a thickness of the first P-type III-V compound layer is 2 to 6 times of a thickness of the undoped III-V compound layer, and the thickness of the first P-type III-V compound layer is 2 to 3 times of a thickness of the N-type III-V compound layer.

6. The HEMT of claim 1, wherein the first P-type III-V compound layer is P-type gallium nitride, the undoped III-V compound layer is undoped gallium nitride, the N-type III-V compound layer is N-type gallium nitride, the second III-V compound layer is aluminum gallium nitride and the first III-V compound layer is gallium nitride.

\* \* \* \* \*